(12) United States Patent
Silvestri (10) Patent No.: US 6,385,129 B1
(45) Date of Patent: May 7, 2002

(54) DELAY LOCKED LOOP MONITOR TEST MODE

(75) Inventor: Paul A. Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/945,509

(22) Filed: Aug. 30, 2001

(51) Int. Cl.[7] .............................. G11C 8/00; H03L 7/06
(52) U.S. Cl. .................... 365/233; 365/193; 365/194; 327/156
(58) Field of Search ................................. 365/233, 201, 365/194, 193; 327/156, 157, 158

(56) References Cited

U.S. PATENT DOCUMENTS 5,754,838 A * 5/1998 Shibata et al. ............... 365/233
6,259,288 B1 * 7/2001 Nishimura .................. 327/156
6,288,585 B1 * 9/2001 Bando et al. ............... 327/156
6,295,245 B1 * 9/2001 Tomita et al. ............... 365/233

* cited by examiner

*Primary Examiner*—Son T. Dinh
(74) *Attorney, Agent, or Firm*—Schwegman, Lundberg, Woessner & Kluth, P.A.

(57) ABSTRACT

A method of forcing a data strobe signal of a memory device on without requiring a read command to be issued is provided. The data strobe signal is controlled by a delay locked loop (DLL). During a normal mode of operation, the DLL turns on the data strobe signal only after a read command is issued to the memory device. The data strobe signal is used as reference signal to track a data signal output from memory cells of the memory device during a read operation. By forcing the data strobe signal on without issuing a read command during a test mode, the characteristics of the DLL in response to other commands can be observed.

47 Claims, 5 Drawing Sheets

DELAY LOCKED LOOP MONITOR TEST MODE

TECHNICAL FIELD OF THE INVENTION

The present invention relates generally to memory devices, and in particular to monitoring a delay locked loop (DLL) of a memory device.

BACKGROUND OF THE INVENTION

Memory devices are widely used in many electronic products and computers to store data. A memory device includes a number of memory cells. Each cell stores one bit of data. The data stored in the memory cells can be read during a read operation.

One type of memory device includes a reference signal to accompany data signals during a read operation. The reference signal, commonly known as a strobe, is used to track the output timing of the data signals read from the memory cells. In some traditional memory devices, the strobe signal is generated by a delay locked loop (DLL). In these devices the DLL turns on the strobe signal only during a read operation, which requires a read command to be issued to the memory device. Therefore, the characteristics of the DLL in the traditional SDRAM devices cannot be monitored until the read command is issued.

For the reasons stated above, and for other reasons which will become apparent to those skilled in the art upon reading and understanding the present specification, there is a need to monitor a DLL in a memory device without requiring a read command to be issued to the memory device.

SUMMARY OF THE INVENTION

The present invention includes a memory device having a DLL. The DLL can be monitored at any time by turning on a strobe signal provided by the DLL. The strobe signal can be turned on without a read command being issued.

In one aspect, the memory device includes a clock input buffer to receive an external clock signal to produce an internal clock signal. A DLL receives the internal clock signal to produce a delayed signal. A strobe circuit receives the delayed signal to provide a strobe signal, and a strobe enable circuit connects to the strobe circuit. The strobe enable circuit includes an input to receive a control signal during a test mode to turn on the strobe signal without a read command being issued to the memory device.

In another aspect, a method of operating a memory device includes producing an internal clock signal from an external clock signal. A delayed signal is generated from the internal clock signal. The method also includes producing a strobe signal from the delayed signal. During a read operation, a first control signal is activated to turn on the strobe signal after a read command is issued. The strobe signal can also be turned on by activating a second control signal during a test mode, in which the strobe signal is turned on without a read command being issued.

DETAILED DESCRIPTION OF THE INVENTION

The following detailed description refers to the accompanying drawings which form a part hereof, and which is shown, by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
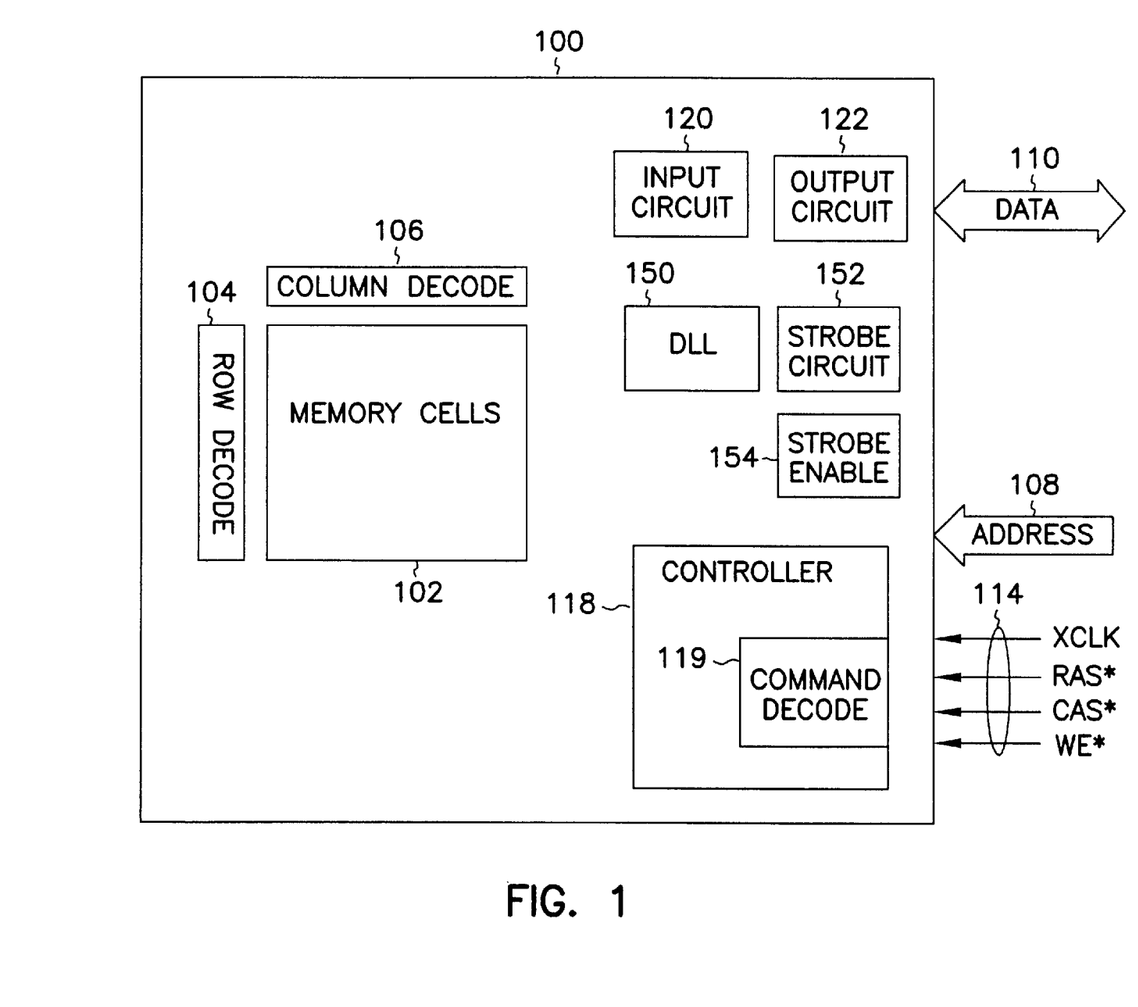
FIG. 1 is a block diagram of a memory device according to the invention.

FIG. 1 is a block diagram of a memory device 100 according to one embodiment of the invention. Memory device 100 includes a plurality of memory cells 102 generally arranged in rows and columns. Row decode circuit 104 and column decode circuit 106 access the rows and columns in response to an address, provided on a plurality of address lines or bus 108. Data is transferred to and from memory device 100 through data lines or bus 110. A memory controller 118 controls data communication to and from memory device 100, via input circuit 120 and output circuit 122 in response to input signals on control lines 114. Controller 118 includes a command decode circuit 119 to receive the input signals to determine the modes of operation of memory device 100. The input signals on lines 114 include, but are not limited to, External Clock (XCLK), Chip Select (CS*), Row Access Strobe (RAS*), Column Access Strobe (CAS*), Write Enable (WE*). In one embodiment, memory device 100 is enclosed in a package or a chip, in which, data, address and control lines 110, 114 and 108 represent external pins of the chip.

Memory device 100 also includes a DLL 150, a strobe circuit 152, and strobe enable circuit 154. DLL 150 provides a clock signal to output a data signal, which is read from memory cells 102 during read operation. DLL 150 also provides a strobe signal. DLL operates in a manner such that the data and strobe signals are synchronized with the external clock signal when they are outputted at data lines 110. Strobe enable circuit 154 controls the output of the strobe signal from DLL 150 during either a read operation or a test mode.

Memory device 100 of FIG. 1 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art Will readily recognize that memory device 100 of FIG. 1 is simplified to illustrate one embodiment of a memory device of the present invention and is not intended to be a detailed description of all of the features of a memory device.

Figure 2:
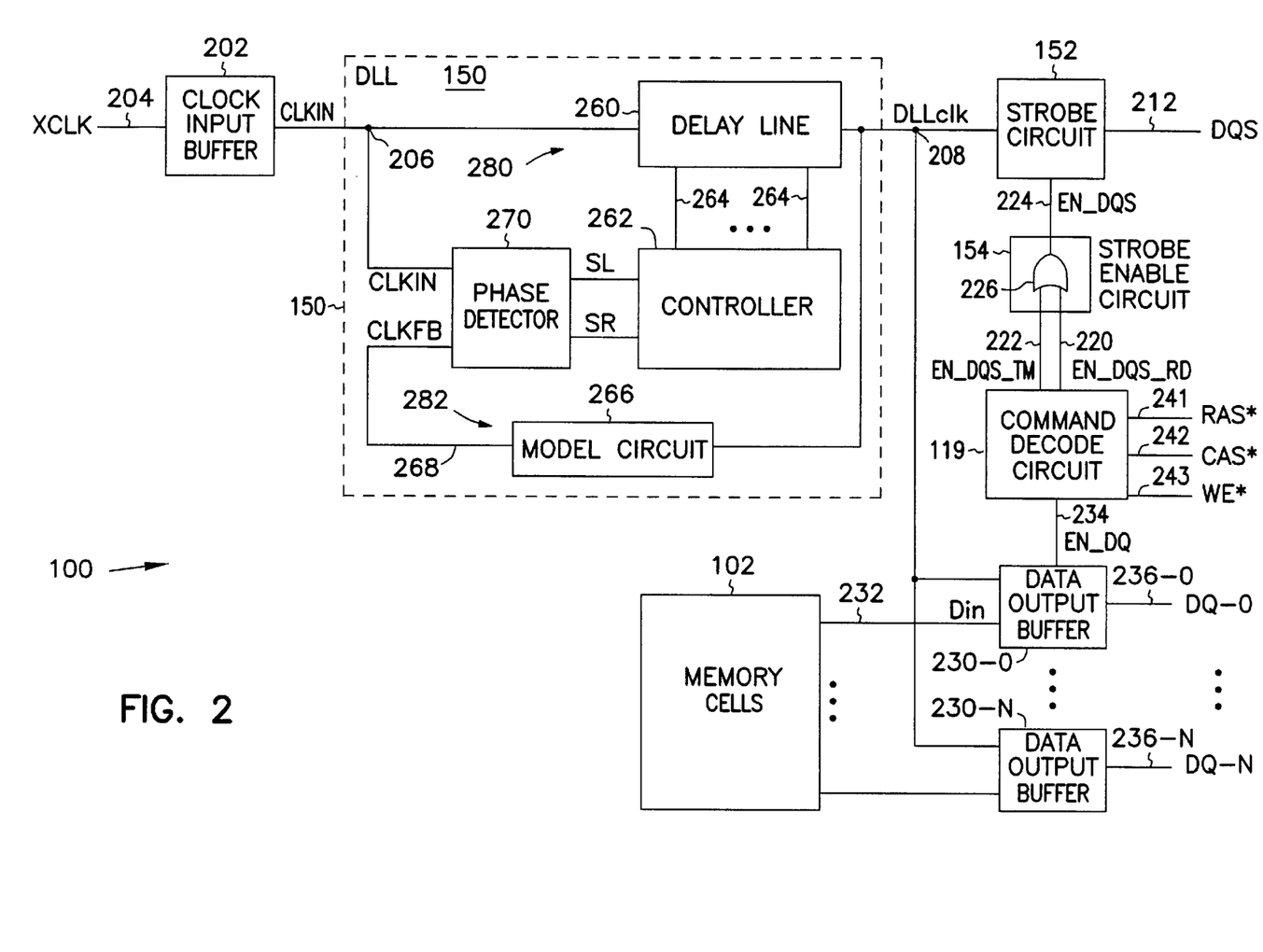
FIG. 2 is a block diagram showing in more detail a portion of the memory device of FIG. 1.

FIG. 2 is a block diagram showing in more detail a portion of the memory device of FIG. 1. Memory device 100 includes a clock input buffer 202 to receive the XCLK signal at node 204 to provide an internal clock signal CLKIN at node 206. DLL 150 receives the CLKIN signal and produces a delayed signal DLLclk at node 208. Strobe circuit 152 receives the DLLclk signal to generate a strobe signal DQS at node 212. The strobe signal is a reference signal or timing signal, which tracks the data signal when the data is outputted. Other circuits or devices, based on the timing of the strobe signal, can accurately capture the data signal. The output of strobe circuit 152 is controlled by an enable signal provided by strobe enable circuit 154, which provides an enable signal EN_DQS to strobe circuit 152 at node 224.

In FIG. 2, strobe enable circuit 154 includes first and second inputs 220 and 222 to receive first and second control signals EN_DQS_RD and EN_DQS_TM. Strobe enable circuit 154 also includes an output 224 to provide the EN_DQS signal. In one embodiment, strobe enable circuit 154 includes an OR gate 226 having first and second input connected to nodes 220 and 222, and an output connected to node 224.

A plurality of data output buffers 230 0-N, represented in FIG. 1 as output circuit 122, provide a plurality of data output signals DQ 0-N. For simplicity, only data output buffer 230-0 is described in more detail. The other data output circuits 230 1-N are arranged in the same fashion. Data output buffer 230-0 includes a clock input connected to node 208 to received the DLLclk signal, a data input 232 to receive a data signal Din from memory cells 102, and an enable input 234 to receive a control signal EN_DQ. Data output buffer 230-0 provides output data DQ-0 on node 236-0. In the embodiment of FIG. 2, a delay caused by strobe circuit 152 is the same as a delay caused by each of data output buffers 230 0-N.

Command decode circuit 119 represented in FIG. 1 also as command decode 119, includes a plurality of inputs 241, 242 and 243 to receive the RAS*, CAS*, and WE* signals, and a plurality of outputs connected to nodes 220, 222, and 234 to provide the EN_DQS_RD, EN_DQS_TM, and EN_DQ signals.

DLL 150 includes a delay line 260 connected to node 206. Delay line 260 connects to a DLL controller 262 via a plurality of control bits 264. Delay line 260 provides a delayed signal DLLclk at node 208. A model circuit 266 receives the DLLclk signal and produces a feedback signal CLKFB on line 268. A phase detector 270 connects to node 206 and 268 to receive the CLKIN and CLKFB signals. Phase detector 270 connects to DLL controller 262 and provides a shift right (SR) and a shift left (SL) signal. From the arrangement of DLL 150, clock input buffer 202 and delay line 260 form a forward path 280; model circuit 266 forms a feedback path 282, which is located between node 208 and phase detector 270.

Circuit elements of DLL 150, such as delay line 260, phase detector 270, controller 262, and model circuit 266 are conventional circuit elements included in a delay locked loop. Therefore, the constructions of these circuit elements of DLL 150 will not be described in detail in this disclosure.

In general, delay line 260 includes a plurality of delay cells connected in a series, in which each of the delay cells can delay a signal for a predetermined amount of time. Depending on the number of delay cells selected, the amount of delay applied to the CLKIN signal varies accordingly.

Phase detector 270 is used to detect a difference between the edges of two signals and provides shifting signals. The shifting signals include shift right (SR) and shift left (SL) signals. In this case, phase detector 270 compares the CLKIN and CLKFB signals to provide to SR and SL signals. When the CLKIN and CLKFB signals are synchronized, phase detector 270 deactivates or disables the SR and SL signals.

Controller 262 includes a shift register, which performs shifting operations based on the SR and SL signals received from phase detector 270. Controller 262 performs a shift right or a shift left operation to adjust the amount of delay applied to the CLKIN signal by delay line 260. When shifting to the right, controller 262 selects fewer delay cells in delay line 260 to decrease the amount of delay applied to the CLKIN signal. In the opposite, when shifting to the left, controller 262 selects more delay cells in delay line 260 to increase the amount of delay applied to the CLKIN signal. By adjusting the delay amount applied to the CLKIN signal, the CLKFB signal is adjusted accordingly. When the CLKIN and CLKFB signals are synchronized, phase detector 270 disables the shifting signals. This causes controller 262 to stop performing the shifting and set DLL 150 in a locked position.

Model circuit 266 is constructed such that its delay matches a delay of clock input buffer 202 and one of the data output buffer 230 0-N. Therefore, a delay of model circuit 266 is equal to the sum of a delay of clock input buffer 202 and a delay of one of the data output buffers 230 0-N. In FIG. 2, the CLKFB signal generated by model circuit 266 of DLL 150 is synchronized with the CLKIN signal. From the embodiment of FIG. 2, model circuit 266 is also identical to clock input buffer 202 and strobe circuit 152, therefore, the XCLK and DQS signals are also synchronized.

In FIG. 2, since the DQS signal is provided by DLL 150, the characteristics of DLL 150 can be monitored by turning on the DQS signal with strobe enable circuit 154. The DQS signal is normally turned on during a read operation, i.e., normal operation, when a read command is issued to memory device 100. However, according to the invention, the DQS signal can be also turned on during a test mode without the read command being issued. The test mode is performed during manufacturing of memory device 100 to ensure its quality.

A read command can be issued by providing one predetermined combination of the RAS*, CAS*, and WE* signals on lines 114 of FIG. 1. In other words, the read command can be issued by one of eight binary combinations of the RAS*, CAS*, and WE* signals. For example, the combination can be High, Low, High, where High indicates logic "1" and low indicates logic "0". A High or Low also indicates voltage signal levels applied to the RAS*, CAS*, and WE* signals.

A test mode can be issued to memory device 100 by providing another one of the eight binary combinations of the RAS*, CAS*, and WE* signals. Within the test mode, a number of different memory operations can be tested by applying different combinations of signals, such as High and Low signal levels to address lines 108 in FIG. 1.

In a test mode, a number of memory operations can be tested, including the read operation. The characteristics of DLL 150 can be monitored or observed during the test mode. For example, in a refresh operation, memory device 100 uses a large amount of power to charge memory cells 102 to retain their current state. During this operation, DLL 150 can be monitored to observe its behavior due to changes in the power supply caused by the operation. In another example, the behavior of DLL 150 is observed due to changes in operating conditions such as voltage or temperature, or both. In all cases, to monitor the characteristics of DLL 150, the DQS signal must be on.

Referring to FIG. 2, in a read operation, certain combination of the RAS*, CAS*, and WE* signals indicating a read command causes command decode circuit 119 to turn on the EN_DQS_RD, and EN_DQ. In response to the read command, a memory cell 102 is accessed, based on an address provided on address lines 108 (FIG. 1). A data signal Din from the memory cell is read and is transferred to node 232. Data output buffer 230 uses the DLLclk signal provided by DLL 150 to receive the Din signal from memory cells 102. At a certain time after the read command, in response to the EN_DQ signal, data output buffer 230 outputs the DQ signal.

In the same read operation, strobe enable circuit 154 receives the EN_DQS_RD signal generated by command decode circuit 119 to activate the EN_DQS signal. The EN_DQS enables strobe circuit 152 to turn on the DQS signal. Since strobe circuit 152 and data output buffer 230 have the same delay and receive the same DLLclk signal, the DQS and DQ are synchronized. In the read operation, the DQS signal is on; thus, the characteristics of DLL 150 can be monitored.

The characteristics of DLL 150 can be monitored during a test mode. In a test, command decode circuit 119 receives certain combinations of the RAS*, CAS*, WE* and ADDRESS signals (108 in FIG. 1) and turns on the EN_DQS_TM signal strobe enable circuit 154 receives the EN_DQS_TM signal and activates the EN_DQS signal. The EN_DQS_TM enables strobe circuit 152 to turn on the DQS signal.

Figure 3:
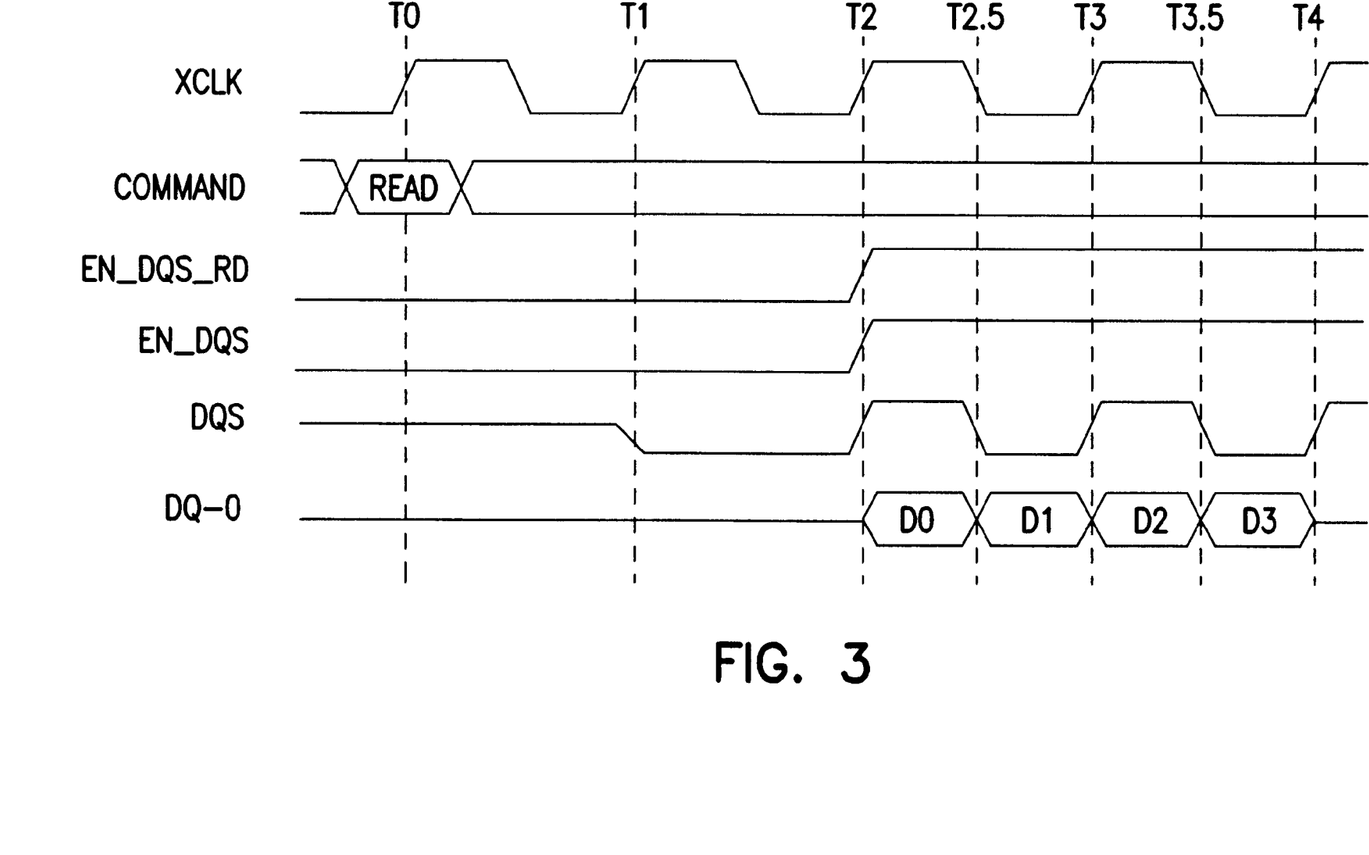
FIG. 3 is a timing diagram of the memory device during a read operation.

FIG. 3 is a timing diagram of the memory device during a read operation. At time T0, a read command READ is issued to memory device 100 at the rising edge of the XCLK signal. For the purpose of describing the invention, it is assumed that memory device 100 is programmed to provide a first data signal two clock cycles after the read command is issued (latency 2). Thus, after two clock cycles after the read command, at time T2, data output buffer 230-0 outputs the first data signal DO. The data signals D1, D2 and D3 are outputted in subsequent transitions of the XCLK signal at times T2.5, T3, and T3.5.

Also at time T2, the EN_DQS_RD makes a transition from a low signal level (LOW) to a high signal level (HIGH). This causes the EN_DQS to switch to HIGH to turn on the DQS signal. In other words, at time T2, the DQS signal makes a transition from LOW to HIGH. From this time on, i.e., from time T2 forward until the end of the READ command, the DQS signal is synchronized with the XCLK and DQ-0 signals.

Figure 4:
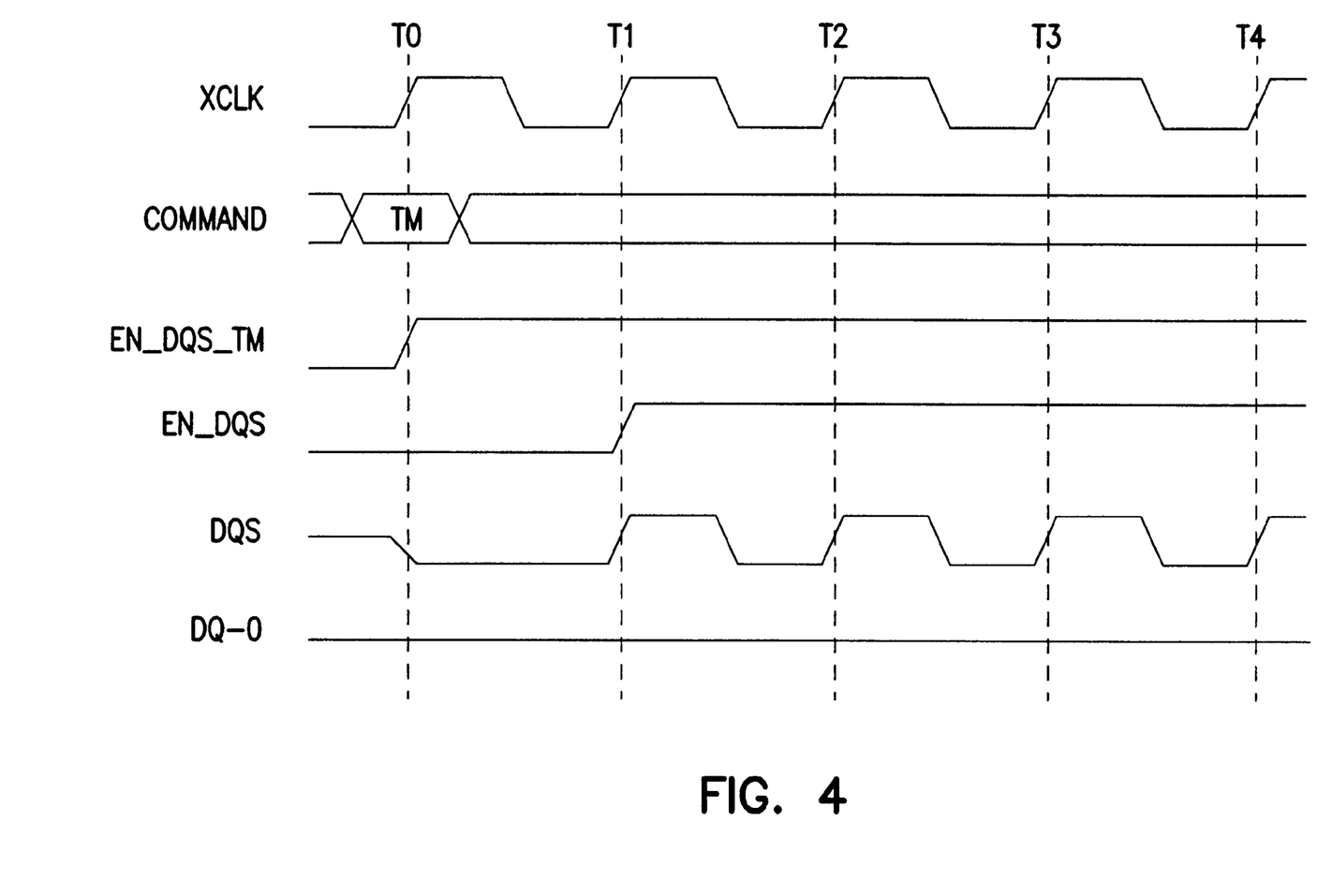
FIG. 4 is a timing diagram of the memory device during a test mode.

FIG. 4 is a timing diagram of the memory device during a test mode. At time T0, a test mode command TM is issued. At time T0, the EN_DQS_TM makes a transition to HIGH. This activates the EN_DQS to HIGH. When the EN_DQS is HIGH, it turns on the DQS signal at time T1. From time T1 forward, the DQS signal is synchronized with the XCLK signal. In this case, the DQS signal is turned on without the READ command being issued. The data DQ-0 signal indicates no data is outputted, until an explicit READ command is issued.

Figure 5:
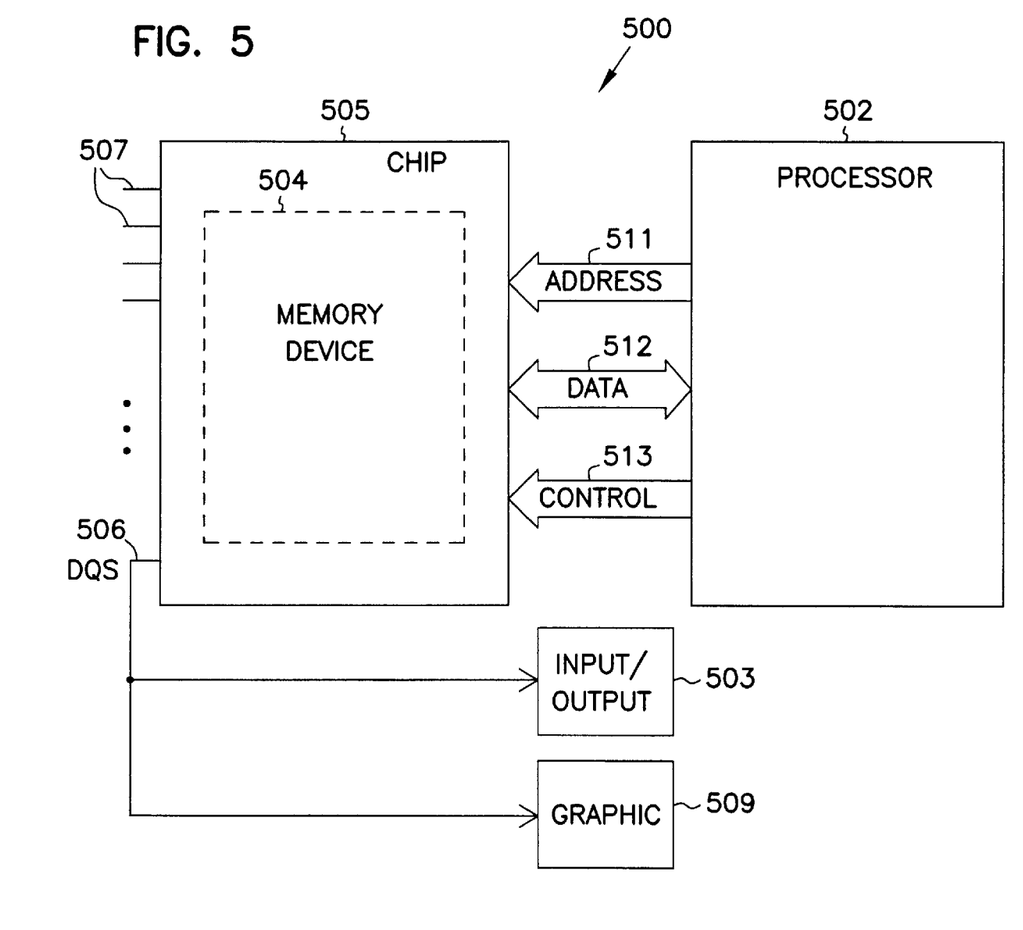
FIG. 5 is a block diagram of a system including the phase splitter according to the invention.

FIG. 5 shows a system 500 according to the invention. System 500 includes a processor 502, and memory device 504. Memory 504 represents memory 100, which is shown and described in FIGS. 1 and 2. Processor 502 can be a microprocessor, digital signal processor, embedded processor, microcontroller, or the like. In addition other devices such as an input/output device 503 and graphic device 509 are included in system 500. In one embodiment of FIG. 5, memory device 504 is formed inside a chip 505, which has a plurality of pins 507 located outside of chip 505. Pins 507 represent lines 241, 242 and 243 shown in FIG. 2.

Processor 502 and memory device 504 communicate using address signals on ADDRESS lines 511, control signals on CONTROL lines 513, and data signals on DATA lines 512.

According to the invention, a DLL in memory device 504 can be monitored without a read command being issued. Furthermore, DLL 150 of memory device 504 can be monitored at chip level. For example, processor 502 can issue a predetermined combination of signals such as the signals RAS*, CAS*, and WE* to pins 507 to turn on the strobe signal DQS on pin or line 506 during a test mode as described previously. Moreover, since the signal DQS is synchronized with the external clock signal, the DQS signal on pin 506 can be used as a main clock signal provided to other devices such as input/output device 503 and graphic device 509.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device comprising:
   a clock input buffer to receive an external clock signal to produce an internal clock signal;
   a delay locked loop (DLL) to receive the internal clock signal to produce a delayed signal;
   a strobe circuit to receive the delayed signal to provide a strobe signal; and
   a strobe enable circuit connected to the strobe circuit, wherein the strobe enable circuit includes a first input to receive a first control signal during a test mode to turn on the strobe signal without a read command being issued.

2. The memory device of claim 1, wherein the strobe enable circuit further includes a second input to receive a second control signal to turn on the strobe signal when a read command is issued.

3. The memory device of claim 1, wherein the external clock and strobe signals are synchronized.

4. The memory device of claim 1, wherein the DLL includes:
   a forward path to apply an amount of delay to the internal clock signal to produce a delayed signal;
   a phase detector to compare the delayed and internal signals to provide shifting signals; and
   a control circuit to adjust the amount of delay applied to the internal clock signal based on the shifting signals.

5. The DLL of claim 4 further includes a feedback path, wherein the feedback path includes a model circuit, wherein a delay of the model circuit is equal to the sum of a delay of the clock input buffer and a delay of the strobe circuit.

6. A memory device comprising:
   a clock input buffer to receive an external clock signal to produce an internal clock signal;
   a delay locked loop (DLL) to receive the internal clock signal to produce a delayed signal;
   a strobe circuit to receive the delayed signal to provide a strobe signal;
   a strobe enable circuit connected to the strobe circuit, the strobe enable circuit including:

a first input to receive a first control signal to turn on the strobe signal during a first mode of memory operation; and a second input to receive a second control signal to turn on the strobe signal during a second mode of memory operation.

7. The memory device of claim 6, wherein a read command is issued to the memory device in the first mode of operation to perform a read operation.

8. The memory device of claim 7, where the second mode of operation is not a read operation.

9. The memory device of claim 8, wherein the second mode of operation is a test operation.

10. The memory device of claim 6, wherein the strobe enable circuit includes an OR gate, the OR gate including first and second inputs to receive the first and second control signals and an output to provide an enable signal to the strobe circuit to turn on the strobe signal.

11. The memory device of claim 6, wherein the external clock and strobe signals are synchronized.

12. The memory device of claim 6, wherein the DLL includes a model circuit, wherein a delay of the model circuit is equal to the sum of a delay of the clock input buffer and a delay of the strobe circuit.

13. A memory device comprising:
a clock input buffer to receive an external clock signal to produce an internal clock signal;
a delay locked loop (DLL) to receive the internal clock signal to produce a delayed signal;
a strobe circuit to receive the delayed signal to provide a strobe signal; and
a strobe enable circuit connected to the strobe circuit, the strobe enable circuit including:
a first input to receive a first control signal to turn on the strobe signal based on a first combination of a plurality of input signals provided to the memory device; and
a second input to receive a second control signal to turn on the strobe signal, based on a second combination of the input signals provided to the memory device.

14. The memory device of claim 13, wherein the first combination of the input signals indicates a read operation.

15. The memory device of claim 14, wherein the second combination of the input signals indicates a test mode.

16. The memory device of claim 13, wherein the strobe enable circuit includes an OR gate, the OR gate including first and second inputs to receive the first and second control signals and an output to provide an enable signal to the strobe circuit to turn on the strobe signal.

17. The memory device of claim 13, wherein the external clock and strobe signals are synchronized.

18. The memory device of claim 13, wherein the DLL includes:
a forward path; and
a feedback path, the feedback path including a model circuit, the model circuit having a model delay, wherein the model delay is equal to the sum of a delay of the clock input buffer and a delay of the strobe circuit.

19. A memory device comprising:
a plurality of memory cells to store data;
clock input buffer to receive an external clock signal to produce an internal clock signal;
a delay locked loop (DLL) to receive the internal clock signal to produce a delayed signal;
a strobe circuit to receive the delayed signal to provide a strobe signal;

a command decode circuit including a plurality of outputs to provide first, second and third control signals;
a data output circuit to receive the third control signal to output a data signal from a memory cell during a first mode of memory operation;
a strobe enable circuit including:
a first input to receive the first control signal to turn on the strobe signal during the first mode of memory operation; and
a second input to receive the second control signal to turn on the strobe signal during a second mode of memory operation.

20. The memory device of claim 19, wherein the first mode of operation is a read operation.

21. The memory device of claim 20, wherein the second mode of operation is a test operation.

22. The memory device of claim 19, wherein the strobe enable circuit includes an OR gate, the OR gate including first and second inputs to receive the first and second control signals and an output to provide an enable signal to the strobe circuit to turn on the strobe signal.

23. The memory device of claim 19, wherein the eternal clock and strobe signals are synchronized.

24. The memory device of claim 19, wherein the strobe circuit and the data output circuit are identical.

25. The memory device of claim 19, wherein the strobe and output data signals are synchronized during the first mode of memory operation.

26. A memory device comprising:
a plurality of memory cells to store data;
a clock input buffer to receive an external clock signal to produce an internal clock signal;
a delay locked loop (DLL) to receive the internal clock signal to produce a delayed signal;
a strobe circuit to receive the delayed signal to provide a strobe signal;
a command decode circuit to receive a plurality of input signals to provide first, second and third control signals;
a data output circuit to receive the second control signal to output a data signal from a memory cell based on a first combination of the input signals;
a strobe enable circuit including:
a first input to receive a first control signal to turn on the strobe signal based on the first combination of the input signals; and
a second input to receive a second control signal to turn on the strobe signal based on a second combination of the input signals.

27. The memory device of claim 26, wherein the first combination of the input signals indicates a read operation.

28. The memory device of claim 27, wherein the second combination of the input signals indicates a test mode.

29. The memory device of claim 26, wherein the strobe enable circuit includes an OR gate, the OR gate having first and second inputs to receive the first and second control signals.

30. The memory device of claim 26, wherein the external clock and strobe signals are synchronized.

31. The memory device of claim 26, wherein the strobe circuit and the data output circuit are identical.

32. The memory device of claim 26, wherein the strobe and output data signals are synchronized.

33. A memory chip comprising:
a plurality of pins located outside the chip;

a memory circuit located inside the chip and connected to the pins, the memory comprising:
  a clock input buffer to receive an external clock signal from one of the pins to produce an internal clock signal;
  a dely locked loop (DLL) to receive the internal clock signal to produce a delayed signal;
  a strobe circuit to receive the delayed signal to provide a strobe signal; and
  a strobe enable circuit connected to the strobe circuit, wherein the strobe enable circuit includes an input to receive a control signal to turn on the strobe signal without a read command being issued.

34. The memory chip of claim 33, wherein the control signal is generated by a combination of input signals applied to the pins during a test mode.

35. A system comprising:
  a processor;
  a memory device connected to the processor, the memory device comprising:
    a clock input buffer to receive an external clock signal to produce an internal clock signal;
    a delay locked loop (DLL) to receive the internal clock signal to produce a delayed signal;
    a strobe circuit to receive the delayed signal to provide a strobe signal; and
    a strobe enable circuit connected to the strobe circuit, wherein the strobe enable circuit includes a first input to receive a control signal during a test mode to turn on the strobe signal without a read command being issued to the memory device.

36. The system of claim 33 further comprising a memory controller connected between the processor and the memory device, wherein the strobe signal is used as a clock signal by the memory controller.

37. A method of operating a memory device, the method comprising:
  producing an internal clock signal from an external clock signal;
  producing a delayed signal from the internal clock signal;
  producing a strobe signal from the delayed signal;
  activating a first control signal to turn on the strobe signal if a read command is issued; and
  activating a second control signal to turn on the strobe signal if a test mode signal is issued, wherein the strobe signal is turned on without a read command being issued.

38. The method of claim 37 further includes synchronizing the strobe signal and the external clock signal.

39. The method of claim 37, wherein activating a first control signal includes receiving a first combination of input signals.

40. The method of claim 39, wherein activating a second control signal includes receiving a second combination of input signals.

41. A method of operating a memory device, the method comprising:
  receiving an external clock signal to produce an internal clock signal;
  receiving the internal clock signal to produce a delayed signal;
  receiving the delayed signal to provide a strobe signal;
  turning on the strobe signal if a first combination of input signals are received; and
  turning on the strobe signal if a second combination of input signals are received.

42. The method of claim 41, wherein turning on the strobe if a first combination includes turning on the strobe signal if the first combination indicates a read operation.

43. The method of claim 41, wherein turning on the strobe if a second combination signal includes turning on the strobe signal if the first combination indicates a test operation.

44. The method of claim 41, wherein turning on the strobe signal includes synchronizing the strobe signal and the external clock signal.

45. A method of operating a memory device, the method comprising:
  delaying an external clock signal to produce an internal clock signal;
  receiving the delay signal to provide a strobe signal;
  receiving a combination of input signals;
  if the combination of input signals indicates a read command:
    reading a data signal from a memory cell;
    turning on the strobe signal; and
    outputting the data signal in synchronism with the strobe signal; and if the combination of input signals indicates a test mode command:
    turning on the strobe without reading a data signal from the memory cell.

46. The method of claim 45 further includes synchronizing the strobe and external clock signals.

47. The method of claim 46, wherein synchronizing includes:
  generating a feedback signal from the delayed signal; and
  comparing the feedback and internal clock signals.

* * * * *